(12) United States Patent
Lim et al.

(10) Patent No.: US 9,536,817 B2
(45) Date of Patent: Jan. 3, 2017

(54) ELECTRONIC DEVICES AND METHODS OF MANUFACTURING ELECTRONIC DEVICES

(71) Applicant: HANA MICRON INC., Asan-si (KR)

(72) Inventors: Jae-Sung Lim, Suwon-si (KR); Hyung-Jun Kim, Yangju-si (KR)

(73) Assignee: HANA MICRON INC., Asan-si (KR)

( * ) Notice: Subject to any disclaimer, the term of this patent is extended or adjusted under 35 U.S.C. 154(b) by 0 days.

(21) Appl. No.: 14/978,593

(22) Filed: Dec. 22, 2015

(65) Prior Publication Data

US 2016/0190043 A1   Jun. 30, 2016

(30) Foreign Application Priority Data

Dec. 31, 2014  (KR) .......................... 10-2014-0194962

(51) Int. Cl.
| | | |
|---|---|---|
| *H01L 23/48* | (2006.01) | |
| *H01L 23/498* | (2006.01) | |
| *H01L 23/29* | (2006.01) | |
| *H01L 23/31* | (2006.01) | |
| *H01L 21/78* | (2006.01) | |
| *H01L 21/56* | (2006.01) | |
| *H01L 23/00* | (2006.01) | |
| *H01L 21/683* | (2006.01) | |
| *H01L 23/36* | (2006.01) | |

(52) U.S. Cl.
CPC ......... *H01L 23/4985* (2013.01); *H01L 21/565* (2013.01); *H01L 21/6836* (2013.01); *H01L 21/78* (2013.01); *H01L 23/293* (2013.01); *H01L 23/3135* (2013.01); *H01L 23/36* (2013.01); *H01L 23/49838* (2013.01); *H01L 24/48* (2013.01); *H01L 24/85* (2013.01); *H01L 2221/6834* (2013.01); *H01L 2221/68327* (2013.01); *H01L 2224/48227* (2013.01); *H01L 2924/07025* (2013.01); *H01L 2924/181* (2013.01)

(58) Field of Classification Search
CPC ........... H01L 23/4985; H01L 23/49838; H01L 23/293; H01L 23/3135
See application file for complete search history.

(56) References Cited

U.S. PATENT DOCUMENTS 6,392,143 B1 * 5/2002 Koshio ................. H01L 21/563
                                                              174/254

OTHER PUBLICATIONS

U.S. Appl. No. 14/978,545, Dec. 22, 2015, Lim et al.

* cited by examiner

*Primary Examiner* — Douglas Menz
(74) *Attorney, Agent, or Firm* — Daly, Crowley, Mofford & Durkee, LLP

(57) ABSTRACT

Disclosed are a foldable and spreadable electronic device and a method of manufacturing the electronic device. The electronic device may include a flexible chip, a protection film and a flexible substrate. The flexible chip may include a first wiring on a first face thereof. The flexible chip may have a foldable and spreadable structure by reducing a thickness from a second face thereof. The protection film may be disposed on the second face of the flexible chip for protecting the flexible chip. The flexible substrate may include a second wiring on one face thereof. The protection film on disposed on the second face of the flexible chip may make contact with the flexible substrate. The first wiring of the flexible chip may be electrically connected to the second wiring of the flexible substrate using a wire.

13 Claims, 3 Drawing Sheets

ELECTRONIC DEVICES AND METHODS OF MANUFACTURING ELECTRONIC DEVICES

CROSS REFERENCE TO RELATED APPLICATIONS

This application claims priority under 35 USC §119 to Korean Patent Application No. 10-2014-0194962, filed on Dec. 31, 2014 in the Korean Intellectual Property Office (KIPO), the entire disclosure of which is incorporated by reference herein.

BACKGROUND

1. Field

The invention relates to electronic devices and method of manufacturing electronic devices. More particularly, the invention relates to foldable and spreadable electronic devices, and methods of manufacturing the foldable and spreadable electronic devices.

2. Related Technology

Electronic devices have been widely utilized in modern electronic industry, so that the electronic devices such as semiconductor memory devices are required to have a high performance, a thin thickness and a minute size. To meet these requirements for the electronic devices, various solutions have been studied and searched. In particular, a flexible electronic device has been recently developed to have a foldable and spreadable structure.

SUMMARY

Example embodiments of the invention provide electronic devices having foldable and spreadable structures as desired.

Example embodiments of the invention provide methods of manufacturing electronic devices having foldable and spreadable structures as desired.

According to one aspect of the invention, there is provided an electronic device including a flexible chip, a protection film, a flexible substrate, etc. The flexible chip may include a first wiring on a first face thereof. The flexible chip may have a foldable and spreadable structure by reducing a thickness from a second face thereof. The protection film may be disposed on the second face of the flexible chip for protecting the flexible chip. The flexible substrate may include a second wiring on one face thereof. In this case, the protection film disposed on the second face of the flexible chip may make contact with the flexible substrate. The first wiring of the flexible chip may be electrically connected to the second wiring of the flexible substrate using a wire.

In example embodiments, the flexible chip may have a thickness in a range of about 1.0 μm to about 50 μm.

In example embodiments, the protection film may include a polyimide film.

In some example embodiments, the protection film may include at least one metal pattern substantially buried therein.

In example embodiments, the flexible substrate may include a flexible printed circuit board (FPCB).

In some example embodiments, an adhesion layer may be additionally disposed between the flexible chip and the protection film.

In some example embodiments, a molding member may be disposed on the flexible chip for sealing the flexible chip.

According to another aspect of the invention, there is provided a method of manufacturing an electronic device. In the method of manufacturing the electronic device, a protection tape may be attached to a first face of a first substrate including a first wiring. A thickness of the first substrate may be reduced from a second face of the first substrate to provide a flexible first substrate having a foldable and spreadable structure. A protection film may be attached to a second face of the flexible first substrate. The protection tape may be removed from the first face of the flexible first substrate. A thermal compression process may be performed to tightly combine the protection film with the flexible first substrate. The flexible first substrate may be cut into individual flexible chips including the first wiring on a first face thereof. A flexible second substrate including a second wiring may be provided. The protection film formed on a second face of the flexible chip may make contact with the flexible second substrate. The first wiring and the second wiring may be electrically connected to each other using a wire.

In example embodiments, the flexible first substrate may have a thickness in a range of about 1 μm to about 50 μm.

In example embodiments, the protection film may include a polyimide film.

In some example embodiments, the protection film may include at least one metal pattern substantially buried therein.

In example embodiments, the flexible second substrate may include a flexible printed circuit board.

In some example embodiments, an adhesion layer may be formed between the flexible chip and the protection film.

In some example embodiments, a molding member for sealing the flexible chip may be formed on the flexible chip after electrically connecting the first wiring to the second wiring.

According to example embodiments, the electronic device may include the wire for electrically connecting wirings therein, and also may include the protection film disposed on the second face of the flexible chip opposed to the first face of the flexible chip on which the first wiring is positioned. The protection film may effectively prevent any damage or impact to the flexible chip during manufacturing processes for the electronic device, such that the electronic device may have an improved reliability. Further, the protection film may enhance the structural stability of the electronic device. Therefore, the electronic device according to example embodiments may advantageously employed in recent electric and electronic apparatuses having a variety of structures.

DESCRIPTION OF EMBODIMENTS

Figure 1:
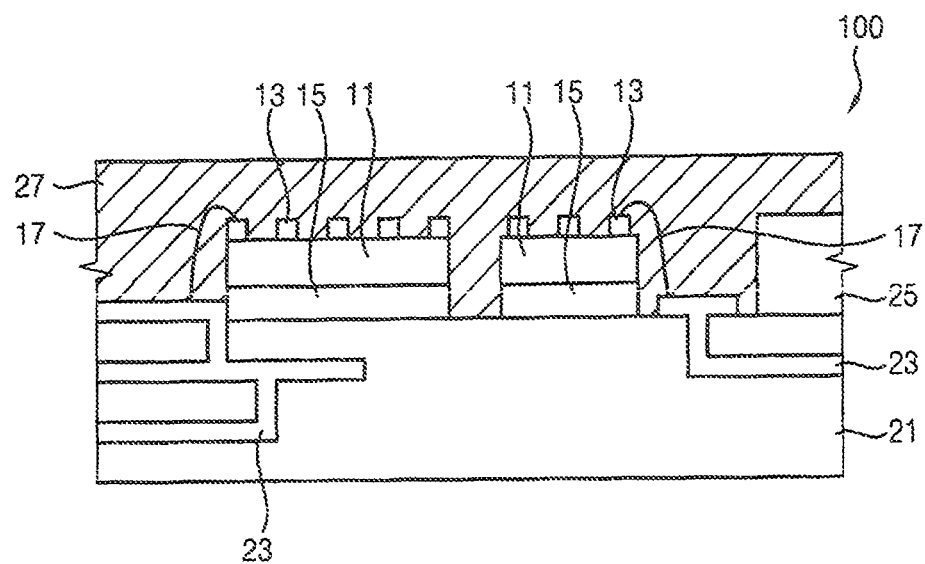
FIG. 1 is a cross-sectional view illustrating an electronic device in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

Like numerals refer to like elements throughout. As used herein, the term "and/or" includes any and all combinations of one or more of the associated listed items. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention. The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating an electronic device in accordance with example embodiments of the invention.

Referring to FIG. 1, an electronic device 100 may include a flexible chip 11, a protection film 15, a flexible substrate 21, etc.

The flexible chip 11 may have a foldable and spreadable structure as desired, and also may generally have a configuration substantially similar to a semiconductor chip in the art. For example, the flexible chip 11 may include a memory semiconductor chip or a non-memory semiconductor chip. Additionally, the flexible chip 11 may include an active element or a passive element.

In example embodiments, the flexible chip 11 may be formed using a flexible substrate such as a silicon substrate, a plastic substrate, a resin substrate, etc. The flexible chip 11 may include a first wiring 13 disposed on a first face of the flexible substrate. For example, the first wiring 13 of the flexible chip 11 may be obtained by forming circuit patterns having various structures on the first face of the flexible substrate. The flexible chip 11 may be provided by reducing a thickness of the flexible substrate. For example, the thickness of the flexible substrate may be decreased by partially removing the flexible substrate from a second face thereof opposed to the first face.

When the flexible chip 11 has a thickness below 1.0 μm, the handling or transferring the flexible chip 11 may not be properly controlled or adjusted. In case that the flexible chip 11 has a thickness above 50 μm, the flexible chip 11 may not be adequately folded and spread as desired. That is, the flexible chip 11 may not have a proper foldable and spreadable structure. Accordingly, the flexible chip 11 may have thickness in a range of about 1.0 μm to about 50 μm.

According to example embodiments, the thickness of the flexible substrate may be reduced by a grinding process or an etching process to thereby provide the flexible chip 11. Alternatively, the flexible chip 11 may be obtained by any suitable process for decreasing the thickness of the flexible substrate. As a result, the flexible chip 11 including the first wiring 13 on a first face thereof may ensure a desired foldable and spreadable structure.

The protection film 15 may be disposed on a second face of the flexible chip 11. The protection film 15 may prevent the flexible chip 11 from being damaged. Further, the protection film 15 may prevent the distortion of the flexible chip 11 in processes for manufacturing the electronic device 100. Accordingly, the protection film 15 may improve the structural stability of the flexible chip 11.

Figure 6:
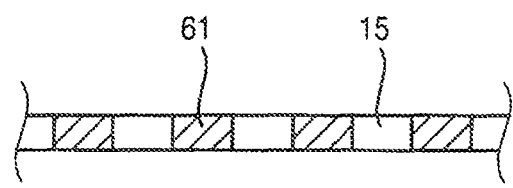
FIG. 6 is a cross-sectional view illustrating a protection film of an electronic device in accordance with example embodiments of the invention.

In example embodiments, the protection film 15 may include a flexible material such as a polyimide (PI) film. Additionally, the protection film 15 may include at least one metal pattern 61 substantially buried therein, as illustrated in FIG. 6. For example, the protection film 15 may include a plurality of metal patterns 61 separated by a predetermined distance. The metal pattern(s) 61 of the protection film 15 may effectively radiate the heat generated from the flexible chip 11. In other words, the protection film 15 including the metal pattern 61 may improve the heat radiating property of the electronic device 100.

As illustrated in FIG. 1, the flexible substrate 21 may include a second wiring 23 disposed on one face thereof. The second wiring 23 of the flexible substrate 21 may have various configurations. For example, the flexible substrate 21 may include a flexible printed circuit board (FPCB). Alternatively, the flexible substrate 21 may include a lead frame.

As for the electronic device 100 illustrated in FIG. 1, the flexible chip 11 may be disposed on the flexible substrate 21. In this case, the protection film 15 may contact the face of the flexible substrate 21 where the second wiring 23 is positioned. In other words, the second face of the flexible chip 11 may face the flexible substrate 21. Thus, the first wiring 13 of the flexible chip 11 may be separated from the second wiring 23 of the flexible substrate 21 by a distance substantially the same as the thicknesses of the protection film 15 and the flexible chip 11.

In example embodiments, the electronic device 100 may include at least one wire 17 for electrically connecting the first wiring 13 of the flexible chip 11 to the second wiring 23 of the flexible substrate 21. That is, the second wiring 23 disposed on one face of the flexible substrate 21 may be electrically connected to the first wiring 13 located on the first face of the flexible chip 11 through the at least one wire 17. The wire 17 may include a material having a high conductivity used in a semiconductor package in the art. For example, the wire 17 may include gold, platinum, silver, etc.

As described above, the electronic device 100 according to example embodiments may include the wire 17 for electrically connecting the flexible chip 11 to the flexible substrate 21. Additionally, the electronic device 100 may include the protection film 15 for preventing the flexible chip 11 from being damaged and for improving the structural stability of the flexible chip 11. Each of the flexible chip 11 and the flexible substrate 21 may have a foldable and spreadable structure, such that the electronic device 100 may also have a foldable and spreadable structure as desired.

In some example embodiments, the electronic device 100 may additionally include an adhesion layer (see FIG. 4) disposed between the protection film 15 and the flexible chip 11. The adhesion layer may enhance the adhesive strength between the flexible chip 11 and the protection film 15.

In some example embodiments, the electronic device 100 may additionally include a molding member 27 for sealing the flexible chip 11. The molding member 27 may substantially cover the first wiring 13 on the flexible chip 11. For example, the molding member 27 may include a flexible material such as an epoxy molding compound (EMC), silicon, etc.

In case that the electronic device 100 includes the molding member 27, the electronic device 100 may ensure the foldable and spreadable structure because the molding member 27 may also include the flexible material.

In some example embodiments, the electronic device 100 may additionally include an additional element 25 such as a passive element disposed on the flexible substrate 21. The additional element 25 may be separated from the flexible chip 11. Thus, the electronic device 100 may have a system in package (SIP) configuration.

Hereinafter, a method of manufacturing an electronic device according to example embodiments will be described with reference to the accompanying drawings.

FIGS. 2 to 5 are cross-sectional views illustrating a method of manufacturing an electronic device in accordance with example embodiments of the invention. In FIGS. 2 to 5, the same reference numerals designate the same elements illustrated in FIG. 1.

Figure 2:
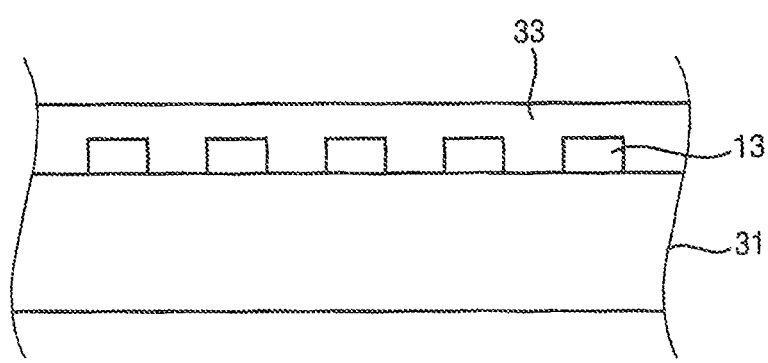
FIGS. 2 to 5 are cross-sectional views illustrating a method of manufacturing an electronic device in accordance with example embodiments of the invention.

Referring to FIG. 2, a protection tape 33 may be attached to a first face of a first substrate 31 including a first wiring 13 disposed on the first face of the first substrate 31. The protection tape 33 may prevent the first wiring 13 from being damaged.

The first substrate 31 may include a flexible substrate, for example, a silicon substrate, a plastic substrate, a resin substrate, etc. The first wiring 13 may include at least one circuit pattern formed on the first substrate 31. Alternatively, the first wiring 13 may include a bump. The first wiring 13 may be formed on the first substrate 31 by common processes utilized in semiconductor manufacturing technology.

The protection tape 33 may include a lamination tape and, in this case, the protection tape 33 may be attached to the first face of the flexible substrate 31 by a rolling process using at least one roller. Alternatively, the protection tape 33 may be provided on the first face of the first substrate 31 by a pressing process.

Figure 3:
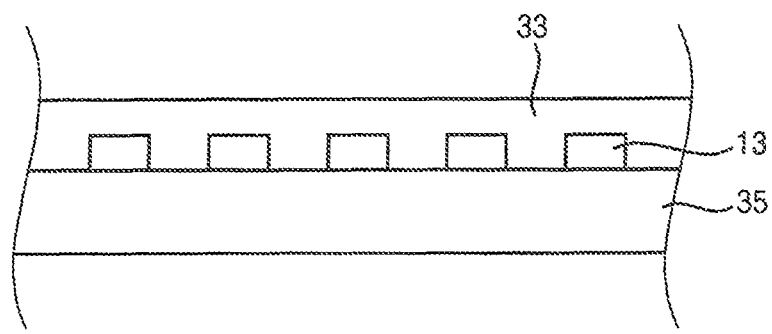

Referring to FIG. 3, the first substrate 31 may be partially removed to have a flexible structure. For example, a thickness of the first substrate 31 may be decreased to thereby provide a flexible first substrate 35.

In example embodiments, the thickness of the first substrate 31 may be reduced by partially removing from a second face of the first substrate 31. For example, the thickness of the first substrate 31 may be decreased by a grinding process, an etching process, etc. The thickness of the first substrate 31 may be reduced such that the flexible first substrate 35 may have a thickness in a range of about 1 μm to about 50 μm. As a result, the flexible first substrate 35 may be foldable and spreadable as desired. While reducing the thickness of the first substrate 31, the protection tape 33 may effectively protect the first wiring 13 disposed on the first face of the flexible first substrate 35.

Figure 4:
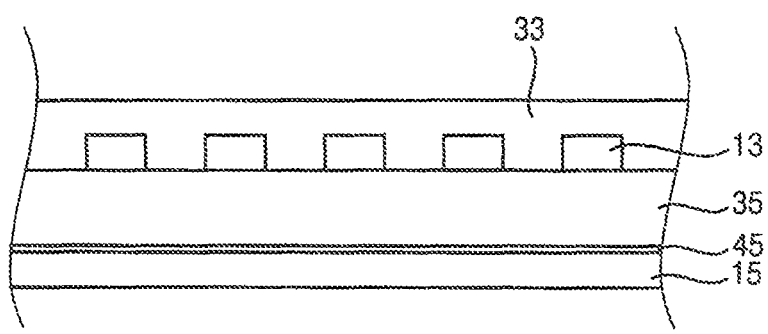

Referring to FIG. 4, a protection film 15 may be attached to a second face of the flexible first substrate 35 so as to protect the flexible first substrate 35 in processes for manufacturing the electronic device.

The protection film 15 may be formed using a flexible material such as a polyimide film by a rolling process. In this case, the protection film 15 may be attached to the second face of the flexible first substrate 35 using at least one roller. In some example embodiments, an adhesion layer 45 may be formed on the second face of the flexible first substrate 35, and then the protection film 15 may be attached to the adhesion layer 45. For example, the adhesion layer 45 may include a die attach film (DAF).

In some example embodiments, the protection film 15 may include at least one metal pattern 61 as illustrated in FIG. 6. The metal pattern 61 of the protection film 15 may improve the heat radiating property of the electronic device.

According to example embodiments, the protection film 15 may prevent the flexible first substrate 35 from being damaged during the handling or manufacturing of the flexible first substrate 35. Further, the protection film 15 disposed on the second face of the flexible first substrate 35 may enhance the structural stability of the electronic device having a configuration substantially the same as that of the electronic device 100 illustrated in FIG. 1.

Figure 5:
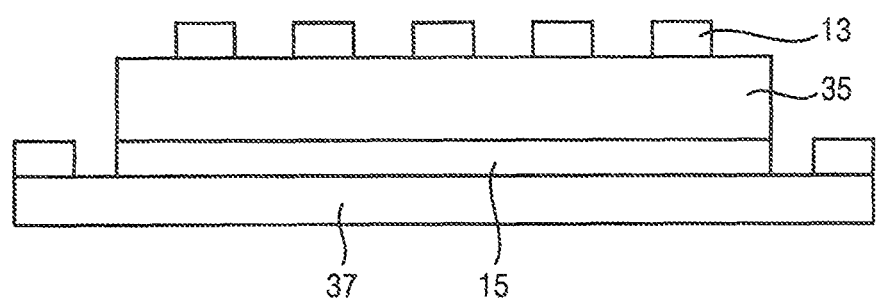

After the formation of the protection film 15, the protection tape 33 may be removed from the first face of the flexible first substrate 35 as illustrated in FIG. 5. Thus, the first wiring 13 formed on the first face of the flexible first substrate 35 may be exposed.

Referring to FIG. 5, a tape 37 for cutting of the flexible first substrate 35 may be attached to the protection film 15. The tape 37 may be provided for a process of cutting the flexible first substrate 35 into individual flexible chips 11 as illustrated in FIG. 1. In case that the flexible first substrate 35 is divided into the flexible chips 11 by a sawing process, the tape 37 may be referred to as a sawing tape. In some example embodiments, the protection tape 33 may be removed from the flexible first substrate 35 after attaching the tape 37 to the protection film 15.

In example embodiments, the flexible first substrate 35 may be tightly combined with the protection film 15 by a thermal compression process. When the thermal compression process may be preformed about the flexible first substrate 35 and the protection film 15, the protection film 15 may be tightly attached to the flexible first substrate 35 without generating a void between the flexible first substrate 35 and the protection film 15.

If the thermal compression process is carried out the flexible first substrate 35 having the protection tape 37 on the first face thereof, the protection tape 37 may be get scorched and stick to the flexible first substrate 35 including the first wirings 13. Accordingly, the thermal compression process may be advantageously carried out after removing the protection tape 37 from the first face of the flexible first substrate 35.

After the thermal compression process, the flexible first substrate 35 may be divided into the individual flexible chips 11 as illustrated in FIG. 1. For example, each of the flexible chips 11 may be obtained by a cutting process such as a sawing process.

A flexible second substrate 21 including a second wiring 23 may be provided as shown in FIG. 1. Here, the second wiring 23 may be disposed on one face of the flexible second substrate 21. The flexible chip 11 may be disposed on the flexible second substrate 21 to thereby provide the electronic device.

When the flexible chip 11 is placed on the flexible second substrate 21, the second face of the flexible chip 11 may face the flexible second substrate 21. That is, the protection film 15 formed on the second face of the flexible chip 11 may make contact with the face of the flexible second substrate 21 on which the second wiring 23 is disposed.

In example embodiments, at least one wire 17 may be formed so as to electrically connect the first wiring 13 of the flexible chip 11 to the second wiring 23 of the flexible second substrate 21. Here, one end of the wire 17 may be connected to the first wiring 13 and the other end of the wire 17 may be connected to the second wiring 23. Thus, the first wiring 13 and the second wiring 23 may be electrically connected to each other through the wire 17. The wire 17 may be formed using a material having a high conductivity, for example, gold, platinum, silver, etc.

The flexible chip 11 may be sealed by forming a mold member (not illustrated) on the first face of the flexible chip 11 to substantially cover the first wiring 13 and the wire 17 formed on the first face of the flexible chip 11. The mold member may be formed using a flexible material such as an epoxy molding compound (EMC) or silicon.

In some example embodiments, an additional element (not illustrated) such as a passive element may be formed on the flexible second substrate 21. The additional element 25 may spaced apart from the flexible chip 11. As a result, the electronic device having a configuration substantially the same as that of the electronic device 100 illustrated in FIG. 1 may be obtained.

According to example embodiments, the electronic device may include the wire for electrically connecting wirings therein, and also may include the protection film disposed on the second face of the flexible chip opposed to the first face of the flexible chip on which the first wiring is positioned. Since the protection film may effectively prevent any damage or impact to the flexible chip during manufacturing processes for the electronic device, the electronic device may have an improved reliability. Further, the protection film may enhance the structural stability of the electronic device. Therefore, the electronic device according to example embodiments may advantageously employed in recent electric and electronic apparatuses having a variety of structures.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An electronic device comprising:
    a flexible chip including a first wiring on a first face thereof, the flexible chip having a foldable and spreadable structure by reducing a thickness from a second face thereof;
    a protection film disposed on the second face of the flexible chip for protecting the flexible chip; and
    a flexible substrate including a second wiring on one face thereof,
    wherein the protection film disposed on the second face of the flexible chip makes contact with the flexible substrate, and the first wiring of the flexible chip is electrically connected to the second wiring of the flexible substrate using a wire, and
    wherein the protection film includes a polyimide film.

2. The electronic device of claim 1, wherein the flexible chip has a thickness in a range of about 1.0 µm to about 50 µm.

3. The electronic device of claim 1, wherein the protection film includes at least one metal pattern buried therein.

4. The electronic device of claim 1, wherein the flexible substrate includes a flexible printed circuit board (FPCB).

5. The electronic device of claim 1, further comprising an adhesion layer disposed between the flexible chip and the protection film.

6. The electronic device of claim 1, further comprising a molding member for sealing the flexible chip.

7. A method of manufacturing an electronic device, comprising:
    attaching a protection tape to a first face of a first substrate including a first wiring;
    reducing a thickness of the first substrate from a second face of the first substrate to provide a flexible first substrate having a foldable and spreadable structure;
    attaching a protection film to a second face of the flexible first substrate;
    removing the protection tape from the first face of the flexible first substrate;
    performing a thermal compression process to tightly combine the protection film with the flexible first substrate;
    cutting the flexible first substrate into individual flexible chips including the first wiring on a first face thereof;
    providing a flexible second substrate including a second wiring; and
    contacting the protection film formed on a second face of the flexible chip to the flexible second substrate, and electrically connecting the first wiring to the second wiring using a wire, wherein the protection film includes a polyimide film.

8. The method claim 7, wherein the flexible first substrate has a thickness in a range of about 1 µm to about 50 µm.

9. The method claim 7, wherein the protection film includes a polyimide film.

10. The method claim 9, wherein the protection film includes at least one metal pattern buried therein.

11. The method claim 7, wherein the flexible second substrate includes a flexible printed circuit board.

12. The method claim 7, further comprising forming an adhesion layer between the flexible chip and the protection film.

13. The method claim 7, further comprising forming a molding member for sealing the flexible chip after electrically connecting the first wiring to the second wiring.

* * * * *